US010205095B2

(12) United States Patent
Sun

(10) Patent No.: US 10,205,095 B2
(45) Date of Patent: Feb. 12, 2019

(54) MOTHER SUBSTRATE FOR FLEXIBLE DISPLAY SUBSTRATE AND METHOD OF MANUFACTURING FLEXIBLE DISPLAY SUBSTRATE

(71) Applicant: BOE Technology Group Co., Ltd., Beijing (CN)

(72) Inventor: Li Sun, Beijing (CN)

(73) Assignee: BOE TECHNOLOGY GROUP CO., LTD., Beijing (CN)

(*) Notice: Subject to any disclaimer, the term of this patent is extended or adjusted under 35 U.S.C. 154(b) by 105 days.

(21) Appl. No.: 15/128,997

(22) PCT Filed: Nov. 17, 2015

(86) PCT No.: PCT/CN2015/094785
§ 371 (c)(1),
(2) Date: Sep. 26, 2016

(87) PCT Pub. No.: WO2016/095643
PCT Pub. Date: Jun. 23, 2016

(65) Prior Publication Data
US 2018/0114904 A1 Apr. 26, 2018

(30) Foreign Application Priority Data
Dec. 19, 2014 (CN) .......................... 2014 1 0804407

(51) Int. Cl.
H01L 51/00 (2006.01)
H01L 21/683 (2006.01)
(Continued)

(52) U.S. Cl.
CPC .......... H01L 51/003 (2013.01); H01L 21/683 (2013.01); H01L 21/6835 (2013.01);
(Continued)

(58) Field of Classification Search
CPC ....................................................... H01L 51/00
See application file for complete search history.

(56) References Cited

U.S. PATENT DOCUMENTS 8,715,802 B2 5/2014 Tsai et al.
9,287,077 B2 3/2016 Su et al.
(Continued)

FOREIGN PATENT DOCUMENTS

CN 102769109 A 11/2012
CN 103531722 A * 1/2014
(Continued)

OTHER PUBLICATIONS

International Search Report and Written Opinion for International Application No. PCT/CN2015/094785, dated Feb. 23, 2016, 8 pages.
(Continued)

Primary Examiner — Marvin Payen
(74) Attorney, Agent, or Firm — Westman, Champlin & Koehler, P.A.

(57) ABSTRACT

Embodiments of the present invention disclose a method of manufacturing a flexible display substrate. The method includes steps of: forming, on a support substrate, a separation pattern layer comprising a plurality of separation units arranged at intervals; forming an adhesion layer on the support substrate formed with the separation pattern layer; forming a flexible base substrate on the adhesion layer and forming a display element on a side of the flexible base substrate opposite to the adhesion layer; performing a peeling preprocessing on the support substrate, and peeling the flexible base substrate from the support substrate to form the flexible display substrate.

20 Claims, 3 Drawing Sheets

(51) Int. Cl.
*H01L 51/56* (2006.01)
*H01L 27/32* (2006.01)

(52) U.S. Cl.
CPC .......... *H01L 51/0097* (2013.01); *H01L 51/56* (2013.01); *H01L 27/3244* (2013.01); *H01L 27/3281* (2013.01); *H01L 2221/6835* (2013.01); *H01L 2221/68318* (2013.01); *H01L 2221/68381* (2013.01); *H01L 2221/68386* (2013.01); *H01L 2227/323* (2013.01); *H01L 2227/326* (2013.01); *H01L 2251/5338* (2013.01)

(56) References Cited

U.S. PATENT DOCUMENTS

| | | |
|---|---|---|
| 9,929,035 B2 | 3/2018 | Bodner et al. |
| 2012/0263945 A1 | 10/2012 | Yoshikawa |
| 2014/0008657 A1 | 1/2014 | Lu et al. |
| 2016/0028012 A1 | 1/2016 | Cheng et al. |
| 2016/0039182 A1 | 2/2016 | Wang |
| 2016/0049601 A1 | 2/2016 | Hsieh et al. |

FOREIGN PATENT DOCUMENTS

| | | | |
|---|---|---|---|
| CN | 103681486 A | | 3/2014 |
| CN | 103682176 A | * | 3/2014 |
| CN | 103700662 A | | 4/2014 |
| CN | 103855171 A | | 6/2014 |
| CN | 103985665 A | | 8/2014 |
| CN | 104051496 A | | 9/2014 |
| CN | 104465479 A | | 3/2015 |
| EP | 2 747 130 A1 | | 6/2014 |

OTHER PUBLICATIONS

First Office Action, including Search Report, for Chinese Patent Application No. 201410804407.X, dated Sep. 20, 2016, 15 pages.
Extended European Search Report for European Patent Application No. 15869152.7, dated Jul. 9, 2018, 10 pages.

* cited by examiner

MOTHER SUBSTRATE FOR FLEXIBLE DISPLAY SUBSTRATE AND METHOD OF MANUFACTURING FLEXIBLE DISPLAY SUBSTRATE

CROSS-REFERENCE TO RELATED APPLICATIONS

This application is a Section 371 National Stage Application of International Application No. PCT/CN2015/094785, filed on 17 Nov. 2015, entitled "MOTHER SUBSTRATE FOR FLEXIBLE DISPLAY SUBSTRATE AND METHOD OF MANUFACTURING FLEXIBLE DISPLAY SUBSTRATE" which claims priority to Chinese Application No. 201410804407.X, filed on 19 Dec. 2014, incorporated herein by reference in their entirety.

BACKGROUND

1. Technical Field

Embodiments of the present invention relate to the field of flexible display, and particularly to a mother substrate for a flexible display substrate and a method of manufacturing a flexible display substrate.

2. Description of the Related Art

A flexible display apparatus comprises an electronic paper (a flexible electrophoretic display), a flexible organic light-emitting diode (OLED) display apparatus, a flexible liquid crystal display (LCD), and the like.

A display substrate used in the flexible display apparatus such as a flexible array substrate for the flexible organic light-emitting diode display apparatus is a flexible display substrate. A base substrate of the flexible display substrate is made of flexible material such as plastic, so that manufacture of the flexible display substrate becomes very difficult. During manufacturing of the flexible display substrate, generally, it is necessary to adhere a flexible base substrate to a rigid and flat support substrate, then to form films and the like constituting a display structure on the flexible base substrate, and finally to peel the manufactured flexible display substrate from the support substrate. This is because that, electronic elements will not be displaced from one another only when an assembling error of a display assembly is calculated in microns. Therefore, during accurate manufacturing of the display assembly, it is necessary to fix a position and a flatness of the flexible display substrate accurately. This requires that the flexible substrate can be firmly combined with the support substrate, and that the flexible substrate can be very easily separated from the support substrate when the flexible display substrate is peeled from the support substrate after the manufacturing is completed. Such requirements are very difficultly satisfied in actual operation since the flexible display substrate will tend to be slightly deformed when being peeled from the support substrate so that the electronic elements and lines are displaced. As a result, the yield is decreased while the cost of a single panel is greatly increased accordingly. In addition, in consideration of influencing factors such as temperature and tension of the flexible display substrate, peeling of the flexible display substrate becomes one of difficulties in manufacturing the flexible display substrate at present.

There are some conventional solutions for the abovementioned difficulties in manufacturing the flexible display substrate. For example, a layer of film is vacuum-deposited on a support substrate, and then a flexible base substrate and a display assembly are placed on the layer of film. After the manufacturing of the flexible display substrate is completed, the flexible display substrate, together with the film, is peeled from the support substrate. Alternatively, a whole layer of the support substrate is evaporated from one side with a laser to facilitate peeling of the flexible substrate from the support substrate and the like. However, with these methods, excessively long time will be consumed or the flexible display substrate will be easily damaged. Therefore, these methods have not been commercially widely applied. For example, when a laser beam is used for a peeling processing between the support substrate and the flexible substrate, intensity and depth of a focus of the laser beam can be controlled However, since pattern layers of the flexible substrate and of the display elements formed on the flexible substrate are very thin, the laser beam will unavoidably damage the display elements. In addition, since a beam area of the laser beam is limited, it is necessary to gradually peel the flexible base substrate from the rigid support substrate by moving the laser beam during peeling, resulting in a phenomenon that the flexible base substrate is unevenly peeled from the support substrate.

SUMMARY

Embodiments of the present invention provide a method of manufacturing a flexible display substrate, and the method comprises steps of:

forming, on a support substrate, a separation pattern layer comprising a plurality of separation units arranged at intervals;

forming an adhesion layer on the support substrate formed with the separation pattern layer;

forming a flexible base substrate on the adhesion layer and forming a display element on a side of the flexible base substrate opposite to the adhesion layer; and performing a peeling preprocessing on the support substrate, and peeling the flexible base substrate from the support substrate to form the flexible display substrate.

Embodiments of the present invention also provide a mother substrate for a flexible display substrate, and the mother substrate comprises: a support substrate, a separation pattern layer, an adhesion layer, and a flexible base substrate, wherein:

the separation pattern layer is formed on the support substrate and comprises a plurality of separation units arranged at intervals;

the adhesion layer is formed on the support substrate formed with the separation pattern layer; and the flexible base substrate is formed on the adhesion layer and a display element is formed on a side of the flexible base substrate opposite to the adhesion layer.

DETAILED DESCRIPTION OF THE EMBODIMENTS

Figure 1:
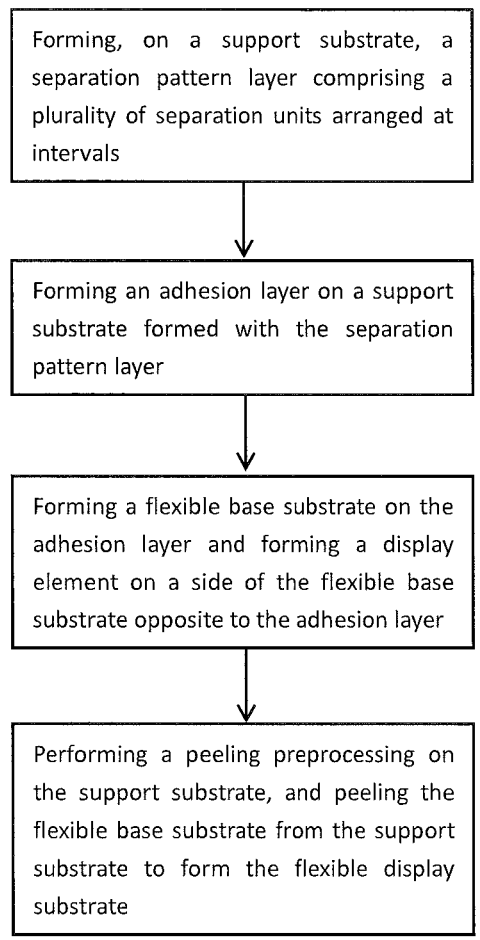
FIG. 1 is a flow diagram of a method of manufacturing a flexible display substrate according to an embodiment of the present invention.
Figure 2:
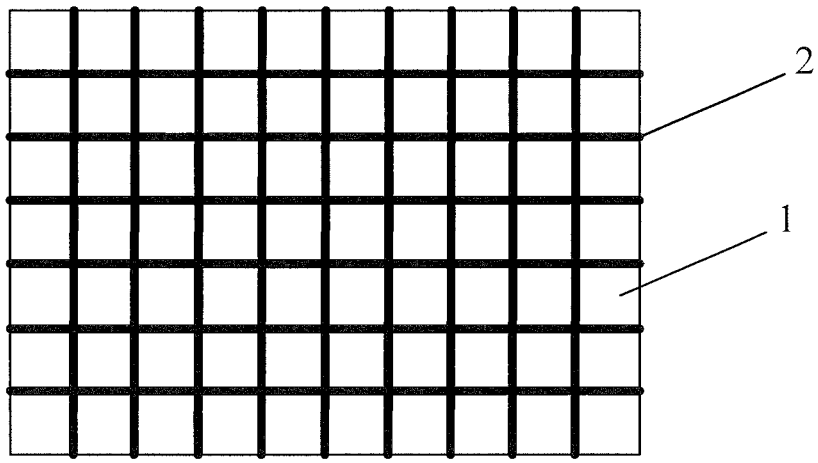
FIG. 2 is a top view of a support substrate formed with a separation pattern layer according to an embodiment of the present invention.

A further description of the invention will be made in detail as below with reference to embodiments of the present invention taken in conjunction with the accompanying drawings. The following embodiments are intended to explain the present invention and the present invention should not be construed as being limited to the embodiments set forth herein. Embodiments of the present invention provide a method of manufacturing a flexible display substrate. As shown in FIGS. 1 and 2, the method comprises the following steps.

In step 1, a separation pattern layer 2 is formed on a support substrate 1. The separation pattern layer 2 comprises a plurality of separation units arranged at intervals.

The support substrate 1 is a rigid and flat substrate. The support substrate may be a single-layer substrate, or may have a composite structure composed of at least two layers of substrates. Whether the support substrate 1 is composed of a single layer or a plurality of layers, the support substrate 1, regarded as a whole, should be a rigid substrate and have a good flatness. For example, the support substrate 1 comprises at least one layer of a metal substrate to improve its heat conductivity. For example, the metal substrate may be a substrate made of a metal having good heat conductivity, such as an iron plate and a steel plate.

In addition, in the embodiments of the present invention, a thickness of the support substrate 1 is not limited. When the support substrate 1 comprises at least two layers of substrates, a ratio of a thickness of the metal substrate to a thickness of the remaining substrate other than the metal substrate is also not limited, as long as heat generated by the metal substrate can be applied to the adhesion layer 3 to heat the adhesion layer 3.

Figure 3:
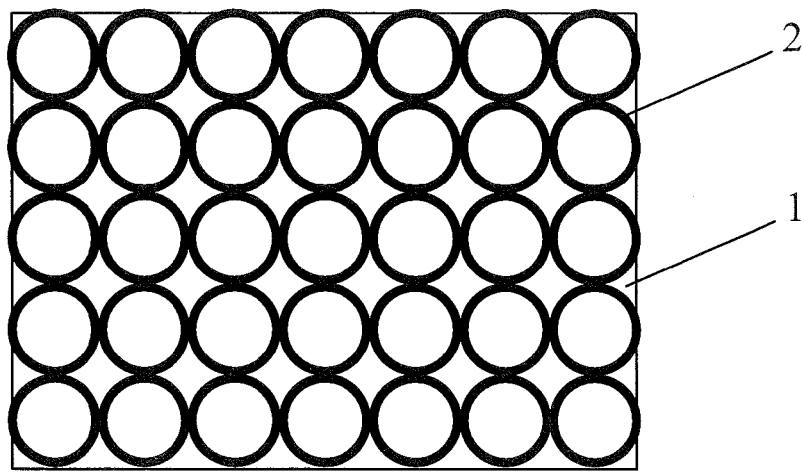
FIG. 3 is a top view of a support substrate formed with a separation pattern layer according to another embodiment of the present invention.

The separation unit may be presented in any possible shape, such as a bar shape, a circular ring shape, a star shape, a dot shape or the like. Further, to form the separation pattern layer 2, the separation units may be arranged at intervals in any possible manner, such as sequentially, crisscross, radially, dispersedly, or the like. For example, the separation units are uniformly distributed to form the separation pattern layer 2. Furthermore, the separation unit has a cross section that may be presented in any possible shape, such as a rectangular shape, a circular shape, a semicircular shape, a trapezoidal shape, or even an irregular shape. FIG. 2 shows a separation pattern layer 2 formed by arranging bar-shaped separation units crisscross, and FIG. 3 shows a separation pattern layer 2 formed by arranging circular-ring-shaped separation units sequentially.

Figure 4:
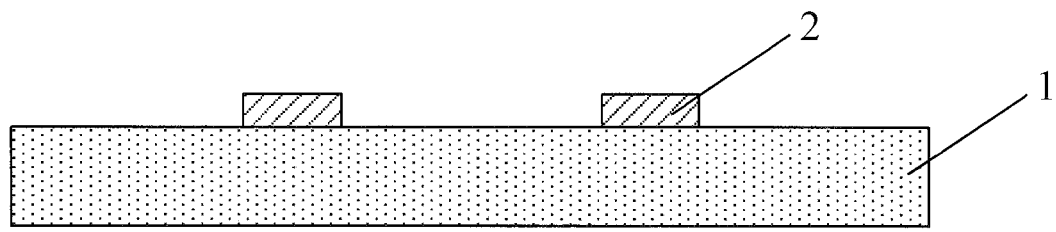
FIG. 4 is a sectional view of a support substrate formed with a separation pattern layer according to an embodiment of the present invention.
Figure 5:
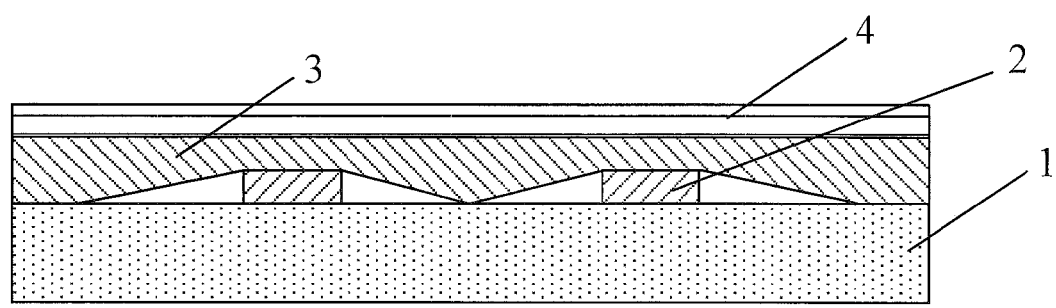
FIG. 5 is a schematic view showing an effect that a gap is generated between the support substrate and the flexible display substrate after the support substrate is heated.

In an embodiment of the present invention, the separation pattern layer 2 is formed on an upper surface of the support substrate 1. FIG. 4 is a sectional view of the support substrate 1 formed with the separation pattern layer 2 on its upper surface. The separation units of the separation pattern layer 2 are formed of thermally deformable material, such as thermally expandable material, thermal gasifiable material, thermally deformable pipe, or the like. In this way, when the flexible display substrate needs to be peeled from the support substrate after manufacturing of the flexible display substrate is completed, the separation pattern layer 2 is deformed, by being heated, in every direction and especially in a direction perpendicular to the support substrate 1, so that a gap is uniformly generated between the flexible display substrate and the support substrate 1, as shown in FIG. 5. As a result, the flexible display substrate can be more easily peeled from the support substrate, thereby alleviating and even eliminating deformation of the flexible display substrate during pealing, and thus improving a yield of the flexible display substrate and decreasing a manufacturing cost of the flexible display substrate.

Figure 6:
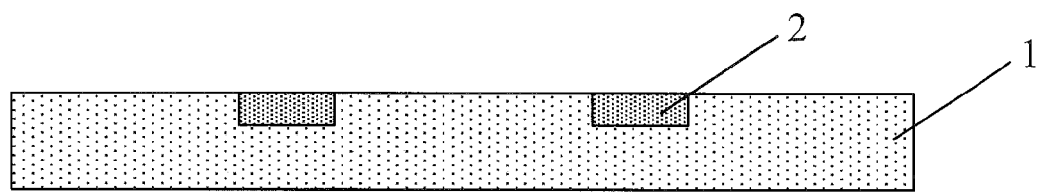
FIG. 6 is a sectional view of a support substrate formed with a separation pattern layer according to another embodiment of the present invention.
Figure 7:
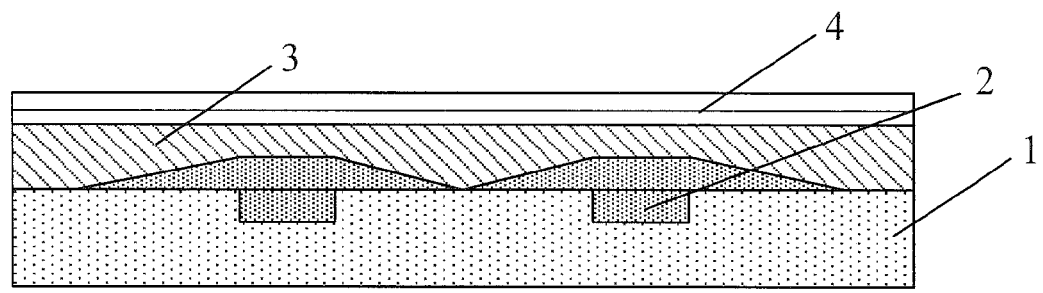
FIG. 7 is a schematic view showing an effect that a gap is generated between the support substrate and the flexible display substrate after the support substrate is pressed.

In another embodiment of the present invention, the separation pattern layer 2 is formed below an upper surface of the support substrate 1. For example, in the support substrate 1, the separation pattern layer 2 is formed in the form of grooves which are able to withstand a certain pressure. FIG. 6 is a sectional view of the support substrate 1 formed with the separation pattern layer 2 below its upper surface. A gas or a liquid is contained in the separation units of the separation pattern layer 2. In an embodiment of the present invention, the gas or the liquid does not corrode the separation pattern layer 2 and the adhesion layer 3 and has no influence on an inert process atmosphere. Nitrogen gas, argon gas, helium gas, silicone oil or the like can be selected as the gas or the liquid. In this way, when the flexible display substrate needs to be peeled from the support substrate after manufacturing of the flexible display substrate is completed, the gas or the liquid contained in the separation units is pushed into between the flexible display substrate and the support substrate by pressing, so that a uniform separated state is formed between the flexible display substrate and the support substrate 1, as shown in FIG. 7. As a result, the flexible display substrate can be more easily peeled from the support substrate, thereby alleviating and even eliminating deformation of the flexible display substrate during pealing, and thus improving a yield of the flexible display substrate and decreasing a manufacturing cost of the flexible display substrate.

It is to be noted that in the embodiments of the present invention, all of a specific shape which the separation units take, a specific arrangement of the separation units, and a specific cross-sectional shape of the separation units are not limited at all. Any appearance of the separation units falls within the protection scope of the present invention so long as it can separate the flexible display substrate from the support substrate as described above.

In addition, the separation pattern layer 2 has an area that should not be greater than an area of the support substrate 1, or the separation units of the separation pattern layer 2 have a total area that should not be greater than the area of the support substrate 1, so as to avoid unnecessary resource waste.

In step 2, an adhesion layer 3 is formed on the support substrate 1 formed with the separation pattern layer 2.

The adhesion layer is made of an adhesive that is deteriorated in viscosity after being heated. For example, the adhesive may be at least one of silane adhesive, polyimide adhesive, and acrylic ester adhesive.

An adhesiveness between the adhesion layer 3 and the separation pattern layer 2 is less than an adhesiveness between the adhesion layer 3 and a flexible base substrate 4.

The adhesion layer 3 functions to fix the flexible base substrate 4 to the support substrate 1. In this way, a position of the flexible base substrate 4 can be accurately fixed, so that electronic elements formed on the flexible base substrate 4 will not displaced from one another to result in an adverse consequence that a flexible display substrate finally manufactured cannot be used.

In step 3, a flexible base substrate 4 is formed on the adhesion layer 3 and a display element is formed on a side of the flexible base substrate 4 opposite to the adhesion layer 3.

The flexible base substrate 4 may be a plastic film. For example, material of the flexible base substrate may comprise at least one of polyimide, polycarbonate, polyacrylate, and polyether imide. In addition, the flexible base substrate 4 may have a structure of a single layer of film or a plurality of layers of film.

The display element means a structure that is indispensable for achieving a display function corresponding to a minimal display unit of the flexible display substrate according to a type of the flexible display substrate and that is composed of layers of patterns. For example, when the flexible display substrate is an array substrate of a flexible liquid crystal display, the display element corresponding to a minimal display unit of the array substrate at least comprises a thin film transistor and a pixel electrode electrically connected to a drain electrode of the thin film transistor. Of course, a common electrode and the like may further be formed in the display element. When the flexible display substrate is a color filter substrate of a flexible liquid crystal display, the display element corresponding to a minimal display unit of the color filter substrate comprises a color layer and a black matrix. Of course, a common electrode and the like may further be formed in the display element. The color layer comprises a red photoresist, a green photoresist and a blue photoresist. The color layer may further comprise a white photoresist. When the flexible display substrate is an array substrate of a flexible organic light-emitting diode, the display element corresponding to a minimal display unit of the array substrate at least comprises a cathode, an anode, and a functional layer of organic material located between the cathode and the anode. More specifically, when the flexible display substrate to be manufactured is a flexible passive OLED display panel, a flexible packaging layer may also be formed, in addition to forming, on the flexible base substrate, an anode, a cathode, and a functional layer of organic material located between the anode and the cathode. The functional layer at least comprises an electron transport layer, a light emitting layer and a hole transport layer. In order to improve efficiency of injection of the electrons and holes into the light emitting layer, for example, the functional layer may further comprise an electron injection layer disposed between the cathode and the electron transport layer, and a hole injection layer disposed between the anode and the hole transport layer. When the flexible display substrate to be manufactured is a flexible active OLED display panel, a flexible packaging layer is further formed, in addition to forming, on the flexible base substrate, a thin film transistor, an anode, a cathode, and a functional layer of organic material located between the anode and the cathode.

Of course, besides the above, the flexible display substrate may further comprise some necessary pattern layers such as a protective layer, or some pattern layers added for improving a displaying effect or overcoming some defects.

In step 4, a peeling preprocessing is performed on the support substrate 1, and the flexible base substrate 4 is peeled from the support substrate 1, to obtain the flexible display substrate.

The peeling preprocessing comprises a processing such as heating or pressing, or the like.

Specifically, as mentioned above, in an embodiment of the present invention, the separation pattern layer 2 is formed on an upper surface of the support substrate 1, and the separation units of the separation pattern layer 2 are formed of thermally deformable material. In this embodiment, after manufacturing of the flexible display substrate is completed, the support substrate 1 is heated. The support substrate 1 transmits heat to the separation pattern layer 2 and the adhesion layer 3 in sequence. The separation pattern layer 2 is deformed in every direction and especially in a direction perpendicular to the support substrate 1 while the adhesion layer 3 is deteriorated in viscosity by being heated, so that a gap is uniformly generated between the flexible display substrate and the support substrate 1, as shown in FIG. 5. In this way, the flexible display substrate can be easily peeled from the support substrate 1, thereby avoiding deformation of the flexible display substrate during pealing, and thus improving a yield of the flexible display substrate and decreasing a manufacturing cost of the flexible display substrate.

As mentioned above, in another embodiment of the present invention, the separation pattern layer 2 is formed below an upper surface of the support substrate 1, and a gas or a liquid is contained in the separation units of the separation pattern layer 2. In this embodiment, after manufacturing of the flexible display substrate is completed, the support substrate 1 is pressed to push the gas or the liquid contained in the separation units into between the flexible display substrate and the support substrate, so that a uniform separated state is formed between the flexible display substrate and the support substrate 1, as shown in FIG. 7. In this way, the flexible display substrate can be easily peeled from the support substrate 1, thereby avoiding deformation of the flexible display substrate during pealing, and thus improving a yield of the flexible display substrate and decreasing a manufacturing cost of the flexible display substrate.

Further, during pealing of the flexible display substrate from the support substrate 1, the adhesion layer 3 may be retained on the flexible display substrate or on the support substrate 1. In the embodiment of the present invention, the processing of the adhesion layer 3 is not limited at all.

It is to be noted that in the heating and the pressing in this step can be implemented in various ways. In the embodiment of the present invention, specific manners of heating and pressing are not limited at all. Any usable processing manners that will not damage the support substrate fall within the scope of the present invention.

Embodiments of the present invention also provide a mother substrate for a flexible display substrate, and the mother substrate comprises: a support substrate 1, a separation pattern layer 2, an adhesion layer 3, and a flexible base substrate 4, wherein:

the separation pattern layer 2 is formed on the support substrate 1 and comprises a plurality of separation units arranged at intervals.

The support substrate 1 is a rigid and flat substrate. The support substrate may be a single-layer substrate, or may have a composite structure composed of at least two layers of substrates. Whether the support substrate 1 is composed of a single layer or a plurality of layers, the support substrate 1, regarded as a whole, should be a rigid substrate and have a good flatness. For example, the support substrate 1 comprises at least one layer of a metal substrate to improve its heat conductivity. For example, the metal substrate may be a substrate made of a metal having good heat conductivity, such as an iron plate and a steel plate.

In addition, in the embodiments of the present invention, a thickness of the support substrate 1 is not limited. When the support substrate 1 comprises at least two layers of substrates, a ratio of a thickness of the metal substrate to a thickness of the remaining substrate other than the metal substrate is also not limited, as long as heat generated by the metal substrate can be applied to the adhesion layer 3 to heat the adhesion layer 3.

The separation unit may be presented in any possible shape, such as a bar shape, a circular ring shape, a star shape, a dot shape or the like. Further, to form the separation pattern layer 2, the separation units may be arranged at intervals in any possible manner, such as sequentially, crisscross, radially, dispersedly, or the like. For example, the separation units are uniformly distributed to form the separation pattern layer 2. Furthermore, the separation unit has a cross section that may be presented in any possible shape, such as a rectangular shape, a circular shape, a semicircular shape, a trapezoidal shape, or even an irregular shape. FIG. 2 shows a separation pattern layer 2 formed by arranging bar-shaped separation units crisscross, and FIG. 3 shows a separation pattern layer 2 formed by arranging circular-ring-shaped separation units sequentially.

In an embodiment of the present invention, the separation pattern layer 2 is formed on an upper surface of the support substrate 1. FIG. 4 is a sectional view of the support substrate 1 formed with the separation pattern layer 2 on its upper surface. The separation units of the separation pattern layer 2 are formed of thermally deformable material, such as thermally expandable material, thermal gasifiable material, thermally deformable pipe, or the like. In this way, when the flexible display substrate needs to be peeled from the support substrate after manufacturing of the flexible display substrate is completed, the separation pattern layer 2 is deformed, by being heated, in every direction and especially in a direction perpendicular to the support substrate 1, so that a gap is uniformly generated between the flexible display substrate and the support substrate 1, as shown in FIG. 5. As a result, the flexible display substrate can be more easily peeled from the support substrate, thereby alleviating and even eliminating deformation of the flexible display substrate during pealing, and thus improving a yield of the flexible display substrate and decreasing a manufacturing cost of the flexible display substrate.

In another embodiment of the present invention, the separation pattern layer 2 is formed below an upper surface of the support substrate 1. For example, in the support substrate 1, the separation pattern layer 2 is formed in the form of grooves which are able to withstand a certain pressure. FIG. 6 is a sectional view of the support substrate 1 formed with the separation pattern layer 2 below its upper surface. A gas or a liquid is contained in the separation units of the separation pattern layer 2. In this way, when the flexible display substrate needs to be peeled from the support substrate after manufacturing of the flexible display substrate is completed, the gas or the liquid contained in the separation units is pushed into between the flexible display substrate and the support substrate by pressing, so that a uniform separated state is formed between the flexible display substrate and the support substrate 1, as shown in FIG. 7. As a result, the flexible display substrate can be more easily peeled from the support substrate, thereby alleviating and even eliminating deformation of the flexible display substrate during pealing, and thus improving a yield of the flexible display substrate and decreasing a manufacturing cost of the flexible display substrate.

It is to be noted that in the embodiments of the present invention, all of a specific shape which the separation units take, a specific arrangement of the separation units, and a specific cross-sectional shape of the separation units are not limited at all. Any appearance of the separation units falls within the protection scope of the present invention so long as it can separate the flexible display substrate from the support substrate as described above.

In addition, the separation pattern layer 2 has an area that should not be greater than an area of the support substrate 1, or the separation units of the separation pattern layer 2 have a total area that should not be greater than the area of the support substrate 1, so as to avoid unnecessary resource waste.

The adhesion layer 3 is formed on the support substrate 1 formed with the separation pattern layer 2.

The adhesion layer 3 is made of an adhesive that is deteriorated in viscosity after being heated. For example, the adhesive may be at least one of silane adhesive, polyimide adhesive, and acrylic ester adhesive.

The adhesion layer 3 functions to fix the flexible base substrate 4 to the support substrate 1. In this way, a position of the flexible base substrate 4 can be accurately fixed, so that electronic elements formed on the flexible base substrate 4 will not displaced from one another to result in an adverse consequence that a flexible display substrate finally manufactured cannot be used.

The flexible base substrate 4 is formed on the adhesion layer 3 and a display element is formed on a side of the flexible base substrate 4 opposite to the adhesion layer 3.

The flexible base substrate 4 may be a plastic film. For example, material of the flexible base substrate may comprise at least one of polyimide, polycarbonate, polyacrylate, and polyether imide. In addition, the flexible base substrate 4 may have a structure of a single layer of film or a plurality of layers of film.

The display element means a structure that is indispensable for achieving a display function corresponding to a minimal display unit of the flexible display substrate according to a type of the flexible display substrate and that is composed of layers of patterns. For example, when the flexible display substrate is an array substrate of a flexible liquid crystal display, the display element corresponding to a minimal display unit of the array substrate at least comprises a thin film transistor and a pixel electrode electrically connected to a drain electrode of the thin film transistor. Of course, a common electrode and the like may further be formed in the display element. When the flexible display substrate is a color filter substrate of a flexible liquid crystal display, the display element corresponding to a minimal display unit of the color filter substrate comprises a color layer and a black matrix. Of course, a common electrode and the like may further be formed in the display element. The color layer comprises a red photoresist, a green photoresist and a blue photoresist. The color layer may further comprise a white photoresist. When the flexible display substrate is an array substrate of a flexible organic light-emitting diode, the display element corresponding to a minimal display unit of the array substrate at least comprises a cathode, an anode, and a functional layer of organic material located between the cathode and the anode. More specifically, when the flexible display substrate to be manufactured is a flexible passive OLED display panel, a flexible packaging layer may also be formed, in addition to forming, on the flexible base substrate, an anode, a cathode, and a functional layer of organic material located between the anode and the cathode. The functional layer at least comprises an electron transport layer, a light emitting layer and a hole transport layer. In order to improve efficiency of injection of the electrons and holes into the light emitting layer, for example, the functional layer may further comprise an electron injection layer disposed between the cathode and the electron transport layer, and a hole injection layer disposed between the anode and the hole transport layer. When the flexible display substrate to be manufactured is a flexible active OLED display panel, a flexible packaging layer is further formed, in addition to forming, on the flexible base substrate, a thin film transistor, an anode, a cathode, and a functional layer of organic material located between the anode and the cathode.

Of course, besides the above, the flexible display substrate may further comprise some necessary pattern layers such as a protective layer, or some pattern layers added for improving a displaying effect or overcoming some defects. After the mother substrate for a flexible display substrate has been manufactured according to a technical solution of the abovementioned embodiment, a peeling preprocessing is performed on the support substrate 1, and the flexible base substrate 4 is peeled from the support substrate 1, to obtain the flexible display substrate. The peeling preprocessing comprises a processing such as heating or pressing, or the like.

Specifically, as mentioned above, in an embodiment of the present invention, the separation pattern layer 2 is formed on an upper surface of the support substrate 1, and the separation units of the separation pattern layer 2 are formed of thermally deformable material. In this embodiment, after manufacturing of the flexible display substrate is completed, the support substrate 1 is heated. The support substrate 1 transmits heat to the separation pattern layer 2 and the adhesion layer 3 in sequence. The separation pattern layer 2 is deformed in every direction and especially in a direction perpendicular to the support substrate 1 while the adhesion layer 3 is deteriorated in viscosity by being heated, so that a gap is uniformly generated between the flexible display substrate and the support substrate 1, as shown in FIG. 5. In this way, the flexible display substrate can be easily peeled from the support substrate 1, thereby avoiding deformation of the flexible display substrate during pealing, and thus improving a yield of the flexible display substrate and decreasing a manufacturing cost of the flexible display substrate.

As mentioned above, in another embodiment of the present invention, the separation pattern layer 2 is formed below an upper surface of the support substrate 1, and a gas or a liquid is contained in the separation units of the separation pattern layer 2. In this embodiment, after manufacturing of the flexible display substrate is completed, the support substrate 1 is pressed to push the gas or the liquid contained in the separation units into between the flexible display substrate and the support substrate, so that a uniform separated state is formed between the flexible display substrate and the support substrate 1, as shown in FIG. 7. In this way, the flexible display substrate can be easily peeled from the support substrate 1, thereby avoiding deformation of the flexible display substrate during pealing, and thus improving a yield of the flexible display substrate and decreasing a manufacturing cost of the flexible display substrate.

Further, during pealing of the flexible display substrate from the support substrate 1, the adhesion layer 3 may be retained on the flexible display substrate or on the support substrate 1. In the embodiment of the present invention, the processing of the adhesion layer 3 is not limited at all. It is to be noted that in the heating and the pressing in this step can be implemented in various ways. In the embodiment of the present invention, specific manners of heating and pressing are not limited at all. Any usable processing manners that will not damage the support substrate fall within the scope of the present invention.

According to the abovementioned technical solution, in the embodiments of the present invention, with provision of the separation pattern layer between the support substrate and the adhesion layer, when the flexible display substrate needs to be peeled from the support substrate after manufacturing of the flexible display substrate is completed, a gap can be uniformly generated between the flexible display substrate and the support substrate by heating. As a result, the flexible display substrate is more easily peeled from the support substrate, thereby alleviating and even eliminating deformation of the flexible display substrate during pealing, and thus improving a yield of the flexible display substrate and decreasing a manufacturing cost of the flexible display substrate.

According to the embodiments of the present invention, with provision of the separation pattern layer between the support substrate and the adhesion layer, when the flexible display substrate needs to be peeled from the support substrate after manufacturing of the flexible display substrate is completed, a gap can be uniformly generated between the flexible display substrate and the support substrate by the peeling preprocessing such as by heating or by pressing. As a result, the flexible display substrate is more easily peeled from the support substrate, thereby alleviating and even eliminating deformation of the flexible display substrate during pealing, and thus improving a yield of the flexible display substrate and decreasing a manufacturing cost of the flexible display substrate. In addition, the technical solutions according to the embodiments of the present invention further have the advantages that they are simple, easy to be implemented, and the like.

It is to be noted that based on the above description, those skilled in the art will appreciate all of the drawings mentioned in the embodiments of the present invention are curt schematic diagrams about manufacturing processes of the flexible display substrate or are schematic diagrams showing a structure of the mother substrate for a flexible display substrate, and they are only intended to clearly illustrate structures relevant to the general inventive concept of the present invention in the technical solutions of the present invention. The other structures irrelevant to the general inventive concept of the present invention belong to existing structures and are partly shown or not shown in the drawings.

The above embodiments are only used to explain the present invention, and should not be construed to limit the present invention. It will be understood by those skilled in the art that various changes and modifications may be made therein without departing from the scope of the present invention. Therefore, all of the equivalent technical solutions also belong to the scope of the present invention. The scope of the present invention is defined in the appended claims.

What is claimed is:

1. A method of manufacturing a flexible display substrate, the method comprising steps of:
    forming, on a support substrate, a separation pattern layer comprising a plurality of separation units arranged at intervals;

forming an adhesion layer on the support substrate formed with the separation pattern layer;

forming a flexible base substrate on the adhesion layer and forming a display element on a side of the flexible base substrate opposite to the adhesion layer; and performing a peeling preprocessing on the support substrate, and peeling the flexible base substrate from the support substrate to form the flexible display substrate, wherein:

the separation pattern layer is formed on an upper surface of the support substrate, and the separation units are formed of thermally deformable material, and the step of performing a peeling preprocessing on the support substrate comprises: heating the support substrate to deform the separation pattern layer in a direction perpendicular to the support substrate while the adhesion layer is deteriorated in viscosity by being heated, so that a gap is uniformly generated between the flexible display substrate and the support substrate.

2. The method of claim 1, wherein:
the separation pattern layer has an area that is not greater than an area of the support substrate.

3. The method of claim 1, wherein:
the separation units of the separation pattern layer have a total area that is not greater than an area of the support substrate.

4. The method of claim 1, wherein:
each of the plurality of separation units has a cross section of a rectangular shape, a circular shape, a semicircular shape, or a trapezoidal shape.

5. The method of claim 1, wherein:
the thermally deformable material comprises a thermally expandable material, a thermal gasifiable material, or a thermally deformable pipe.

6. A method of manufacturing a flexible display substrate, the method comprising steps of:

forming, on a support substrate, a separation pattern layer comprising a plurality of separation units arranged at intervals;

forming an adhesion layer on the support substrate formed with the separation pattern layer;

forming a flexible base substrate on the adhesion layer and forming a display element on a side of the flexible base substrate opposite to the adhesion layer; and performing a peeling preprocessing on the support substrate, and peeling the flexible base substrate from the support substrate to form the flexible display substrate, wherein the separation pattern layer is formed below an upper surface of the support substrate, and a gas or a liquid is contained in the separation units.

7. The method of claim 6, wherein:
the separation units comprise grooves formed in the support substrate.

8. The method of claim 7, wherein:
the step of performing a peeling preprocessing on the support substrate comprises: pressing the support substrate to push the gas or the liquid contained in the separation units into between the flexible display substrate and the support substrate, so that a uniform separated state is formed between the flexible display substrate and the support substrate.

9. The method of claim 6, wherein:
the step of performing a peeling preprocessing on the support substrate comprises: pressing the support substrate to push the gas or the liquid contained in the separation units into between the flexible display substrate and the support substrate, so that a uniform separated state is formed between the flexible display substrate and the support substrate.

10. The method of claim 6, wherein:
the separation pattern layer has an area that is not greater than an area of the support substrate.

11. The method of claim 6, wherein:
the separation units of the separation pattern layer have a total area that is not greater than an area of the support substrate.

12. A mother substrate for a flexible display substrate, the mother substrate comprising:

a support substrate, a separation pattern layer, an adhesion layer, and a flexible base substrate, wherein:

the separation pattern layer is formed on the support substrate and comprises a plurality of separation units arranged at intervals;

the adhesion layer is formed on the support substrate formed with the separation pattern layer; and the flexible base substrate is formed on the adhesion layer and a display element is formed on a side of the flexible base substrate opposite to the adhesion layer, wherein the separation pattern layer is formed on an upper surface of the support substrate, and the separation units are formed of thermally deformable material, such that when heating the support substrate, the separation pattern layer is deformed in a direction perpendicular to the support substrate so that a gap is uniformly generated between the flexible display substrate and the support substrate.

13. The mother substrate of claim 12, wherein:
the separation pattern layer has an area that is not greater than an area of the support substrate.

14. The mother substrate of claim 12, wherein:
the separation units of the separation pattern layer have a total area that is not greater than an area of the support substrate.

15. The mother substrate of claim 12, wherein:
the adhesion layer is made of an adhesive that is deteriorated in viscosity after being heated.

16. The mother substrate of claim 12, wherein:
each of the plurality of separation units has a cross section of a rectangular shape, a circular shape, a semicircular shape, or a trapezoidal shape.

17. The mother substrate of claim 12, wherein:
the thermally deformable material comprises a thermally expandable material, a thermal gasifiable material, or a thermally deformable pipe.

18. A mother substrate for a flexible display substrate, the mother substrate comprising:

a support substrate, a separation pattern layer, an adhesion layer, and a flexible base substrate, wherein:

the separation pattern layer is formed on the support substrate and comprises a plurality of separation units arranged at intervals;

the adhesion layer is formed on the support substrate formed with the separation pattern layer; and the flexible base substrate is formed on the adhesion layer and a display element is formed on a side of the flexible base substrate opposite to the adhesion layer, wherein the separation pattern layer is formed below an upper surface of the support substrate, and a gas or a liquid is contained in the separation units.

19. The mother substrate of claim 18, wherein:
the separation units comprise grooves formed in the support substrate.

20. The mother substrate of claim 18, wherein:
the adhesion layer is made of an adhesive that is deteriorated in viscosity after being heated.

* * * * *